United States Patent
Ichiki et al.

(10) Patent No.: US 7,144,520 B2
(45) Date of Patent: Dec. 5, 2006

(54) ETCHING METHOD AND APPARATUS

(75) Inventors: Katsunori Ichiki, Kanagawa (JP); Kazuo Yamauchi, Kanagawa (JP); Hirokuni Hiyama, Kanagawa (JP); Seiji Samukawa, Miyagi (JP)

(73) Assignees: Ebara Corporation, Tokyo (JP); Japan as Represented by President of Tohoku University, Sendai (JP)

(*) Notice: Subject to any disclaimer, the term of this patent is extended or adjusted under 35 U.S.C. 154(b) by 126 days.

(21) Appl. No.: 10/493,414

(22) PCT Filed: Nov. 8, 2002

(86) PCT No.: PCT/JP02/11658

§ 371 (c)(1),
(2), (4) Date: Apr. 22, 2004

(87) PCT Pub. No.: WO03/044842

PCT Pub. Date: May 30, 2003

(65) Prior Publication Data

US 2004/0244687 A1   Dec. 9, 2004

(30) Foreign Application Priority Data

Nov. 19, 2001 (JP) .............................. 2001-353809

(51) Int. Cl.
*H01L 21/00* (2006.01)
*B44C 1/22* (2006.01)

(52) U.S. Cl. ............................ 216/37; 216/66; 216/67; 216/71; 216/94; 250/492.3; 204/192.3; 204/192.34; 438/694

(58) Field of Classification Search .................. 216/67, 216/71, 94, 66, 37; 250/492.3; 204/192.3–192.34; 438/694

See application file for complete search history.

(56) References Cited

U.S. PATENT DOCUMENTS

| 4,523,971 A | * | 6/1985 | Cuomo et al. | 156/345.39 |
| 5,399,254 A | * | 3/1995 | Geisler et al. | 204/298.31 |
| 5,462,629 A | * | 10/1995 | Kubota et al. | 156/345.55 |
| 5,501,893 A | | 3/1996 | Laermer et al. | |
| 6,156,669 A | * | 12/2000 | Knappenberger | 438/758 |
| 6,641,747 B1 | * | 11/2003 | Lukanc et al. | 216/61 |
| 2005/0020070 A1 | * | 1/2005 | Ichiki et al. | 438/689 |

FOREIGN PATENT DOCUMENTS

JP    5-102087    4/1993

OTHER PUBLICATIONS

Seiji Samukawa et al.; Japan J. Appl. Phys., vol. 40, Part 2, No. 10A, pp. L997-L999. Oct. 1, 2001. See PCT search report.
Takashi Tokuyama; Handotai Dry Etching Gijutsu, Sangyo-Tosho, Oct. 6, 1994, pp. 111-112. See PCT search report.

* cited by examiner

*Primary Examiner*—Shamim Ahmed
(74) *Attorney, Agent, or Firm*—Westerman, Hattori, Daniels & Adrian, LLP.

(57) ABSTRACT

An etching apparatus comprises a workpiece holder (21) for holding a workpiece (X), a plasma generator (10, 20) for generating a plasma (30) in a vacuum chamber (3), an orifice electrode (4) disposed between the workpiece holder (21) and the plasma generator (10, 20), and a grid electrode (5) disposed upstream of the orifice electrode (4) in the vacuum chamber (3). The orifice electrode (4) has orifices (4*a*) defined therein. The etching apparatus further comprises a voltage applying unit (25, 26) for applying a voltage between the orifice electrode (4) and the grid electrode (5) to accelerate ions from the plasma (30) generated by the plasma generator (10, 20) and to pass the extracted ions through the orifices (4*a*) in the orifice electrode (4). A first collimated neutral particle beam is generated and applied to the workpiece (X) for etching a surface of a processing layer (60) of the workpiece (X). A second collimated neutral particle beam is generated, and a mask (50) for covering at least a portion of the surface of the processing layer (60) is sputtered by the second neutral particle beam to form a protecting film (80) on a sidewall (60*a*) of the processing layer (60) for protecting the sidewall (60*a*) of the processing layer (60) from being etched by the first neutral particle beam.

16 Claims, 5 Drawing Sheets

ETCHING METHOD AND APPARATUS

TECHNICAL FIELD

The present invention relates to an etching method and apparatus suitable for use in micromachining processes involved in the fabrication of semiconductor devices or the like, and more particularly to an etching method and apparatus for processing a surface of a workpiece with use of a neutral particle beam generated by neutralizing positive or negative ions generated in a plasma.

BACKGROUND ART

In recent years, semiconductor integrated circuits, micromachines, and the like have been processed in highly fine patterns. Therefore, a highly accurate process with a high selectivity and a process to form a high aspect ratio pattern are required. In the fields of such processing, there has widely been used a plasma etching apparatus.

As a plasma etching apparatus, there has been known a reactive ion etching (RIE) apparatus which generates various kinds of particles including positive ions and radicals. The positive ions or the radicals are applied to a workpiece to etch the workpiece.

In an etching process utilizing such an RIE apparatus, there have been problems that high accuracy and high selectivity cannot be achieved simultaneously and etching profile irregularities are caused by charge build-up. The selectivity is a ratio of the etched depth in a workpiece to the etched depth in a mask or an underlying material. Specifically, when a workpiece is etched by x μm and a mask protecting the workpiece is etched by y μm, the selectivity s is expressed by s=x/y. In the case of a higher selectivity, the mask is less damaged and the workpiece can be etched to form a pattern having a high aspect ratio.

In order to enhance the selectivity, a combination of gases which can deposit on the mask or the underlying material but can etch the workpiece has been used in the conventional etching process. Further, radicals deposit onto the sidewall surface of the workpiece to form a sidewall passivation layer. If the sidewall passivation layer is excessively formed on the surface of the workpiece, then the surface of the workpiece is processed into a tapered shape, so that dimensional accuracy is lowered in the etching process. When a combination of $Cl_2$ gas and $O_2$ gas is used in the conventional etching process, the selectivity of $Si/SiO_2$ is at most about 100. Thus, this combination of gases can achieve a higher selectivity than other combinations of gases. However, devices having a pattern smaller than 0.1 μm have been required to be processed with high accuracy and a selectivity higher than 300. Particularly, it will be the future task to simultaneously achieve a higher selectivity over an underlying layer of a gate oxide film and no residue at step portions for isolation.

The etching profile irregularities are caused by the difference between the behavior of electrons and that of positive ions. Specifically, the etching profile irregularities, i.e., notches, are produced at sidewalls defining stripes of a fine pattern. When the etching process is performed with a low energy ion beam, electrons are decelerated within the fine pattern by a negative self-bias potential on the workpiece, and trapped near a resist. On the other hand, ions are accelerated and delivered to the underlying layer of the oxide film to develop positive charge build-up on the workpiece. However, at the outside of the fine pattern, charge build-up is not developed because the same amounts of electrons and ions are delivered thereto and neutralized. Thus, a potential difference is produced between the inside and outside of the fine pattern, so that the trajectories of the ions are curved to produce the notches.

DISCLOSURE OF INVENTION

The present invention has been made in view of the above drawbacks. It is therefore an object of the present invention to provide an etching method and apparatus which can etch a surface of a workpiece without charge build-up or etching profile irregularities on the workpiece, and can simultaneously achieve high accuracy and high selectivity over a mask or an underlying layer for a fine pattern.

According to a first aspect of the present invention, there is provided an etching method comprising: etching a surface of a processing layer of a workpiece by generating a first collimated neutral particle beam from a first gas and applying the first neutral particle beam to the workpiece; and forming a protecting film on a sidewall of the processing layer for protecting the sidewall of the processing layer from being etched by the first neutral particle beam. The first neutral particle beam should preferably have an energy ranging from 10 eV to 50 eV.

According to the present invention, in the etching process, the surface of the processing layer is etched by the first neutral particle beam having no electric charges but having a large translational energy ranging from 10 eV to 50 eV. Therefore, secondary electrons are not emitted from the surface of the processing layer, and hence the workpiece can be etched with a lower charge build-up voltage. Further, since the collimated neutral particle beam is applied to the workpiece, the workpiece can highly accurately be etched even in the case where a sidewall passivation layer is not formed on the surface of the processing layer. Specifically, the processing layer is hardly sputtered by the neutral particle beam having a low energy ranging form 10 eV to 50 eV, and thermochemical reaction occurs between the neutral particle beam and the processing layer. As a result, a reaction product is spontaneously sublimed on the processing layer to perform the etching process. If the neutral particles have no directionality and execute thermal motion, then the workpiece is isotropically etched. However, according to the present invention, since the neutral particle beam is collimated, anisotropic etching can be achieved. When the neutral particle beam has an energy ranging from 10 eV to 50 eV, a resist is hardly sputtered by the neutral particle beam. Therefore, the workpiece can be etched with high selectivity.

When an ion beam having a low energy is applied to the workpiece in a conventional RIE apparatus, the ion beam may be curved due to an electric field produced by charge unbalance between ions and electrons within a fine pattern, so that notches may be produced as local etching profile irregularities. According to the present invention, however, since the etching method utilizes a neutral particle beam, it is possible to etch the workpiece to form a pattern having a high aspect ratio without generating notches.

In the forming process, the protecting film can be formed on the sidewall of the processing layer for protecting the sidewall of the processing layer from being etched by the first neutral particle beam. Therefore, a highly accurate etching process can be achieved in such a state that the sidewall of the processing layer is prevented from being etched by the first neutral particle beam. Thus, the etching method according to the present invention can simultaneously achieve high accuracy and high selectivity for a fine pattern.

According to a preferred aspect of the present invention, the etching method further comprises covering at least a portion of the surface of the processing layer with a shielding member, the forming comprising: generating a second collimated neutral particle beam from the first gas; and sputtering the shielding member by the second neutral particle beam to form the protecting film on the sidewall of the processing layer. The second neutral particle beam should preferably have an energy ranging from 50 eV to 200 eV.

According to a preferred aspect of the present invention, the forming comprises: generating a second collimated neutral particle beam from a second gas; and applying the second neutral particle beam to the surface of the processing layer to form the protecting film on the sidewall of the processing layer.

According to a preferred aspect of the present invention, the processing layer comprises a silicon layer, the first gas includes $SF_6$, and the second gas includes a fluorocarbon gas.

According to a preferred aspect of the present invention, the processing layer comprises a silicon layer, and a layer underlying the processing layer comprises a silicon oxide film; wherein the forming is performed immediately before the etching is completed, and then the etching is performed again.

Thus, the present invention is suitable for use in a gate etching process in which the processing layer comprises a silicon layer and a layer underlying the processing layer comprises a silicon oxide film. According to the present invention, a gate etching process with a high selectivity can be performed without any residues or any damages on the workpiece.

According to a preferred aspect of the present invention, the etching method further comprises removing the protecting film formed on the sidewall of the processing layer.

According to a preferred aspect of the present invention, the etching method further comprises repeating the etching, the removing, and the forming.

According to a second aspect of the present invention, there is provided an etching apparatus comprising: a workpiece holder for holding a workpiece; a plasma generator for generating a plasma in a vacuum chamber; a first electrode disposed between the workpiece holder and the plasma generator, the first electrode having orifices defined therein; a second electrode disposed upstream of the first electrode in the vacuum chamber; and a voltage applying unit for applying a voltage between the first electrode and the second electrode to accelerate ions from the plasma generated by the plasma generator and to pass the extracted ions through the orifices in the first electrode; wherein a first collimated neutral particle beam is generated and applied to the workpiece for etching a surface of a processing layer of the workpiece; wherein a second collimated neutral particle beam is generated, and a shielding member for covering at least a portion of the surface of the processing layer is sputtered by the second neutral particle beam to form a protecting film on a sidewall of the processing layer for protecting the sidewall of the processing layer from being etched by the first neutral particle beam. The first neutral particle beam should preferably have an energy ranging from 10 eV to 50 eV. The second neutral particle beam should preferably have an energy ranging from 50 eV to 200 eV.

According to a preferred aspect of the present invention, the etching apparatus further comprises an end point detector for detecting an end point of an etching process.

According to a third aspect of the present invention, there is provided an etching apparatus comprising: a workpiece holder for holding a workpiece; a plasma generator for generating a plasma in a vacuum chamber; a first electrode disposed between the workpiece holder and the plasma generator, the first electrode having orifices defined therein; a second electrode disposed upstream of the first electrode in the vacuum chamber; and a voltage applying unit for applying a voltage between the first electrode and the second electrode to accelerate ions from the plasma generated by the plasma generator and to pass the extracted ions through the orifices in the first electrode; wherein a first collimated neutral particle beam is generated and applied to the workpiece for etching a surface of a processing layer of the workpiece; wherein a second collimated neutral particle beam is generated, and the first electrode is sputtered by the second neutral particle beam to form a protecting film on a sidewall of the processing layer for protecting the sidewall of the processing layer from being etched by the first neutral particle beam. The first neutral particle beam should preferably have an energy ranging from 10 eV to 50 eV. The second neutral particle beam should preferably have an energy ranging from 50 eV to 200 eV.

According to a preferred aspect of the present invention, the etching apparatus further comprises an end point detector for detecting an end point of an etching process.

BEST MODE FOR CARRYING OUT THE INVENTION

Figure 1:
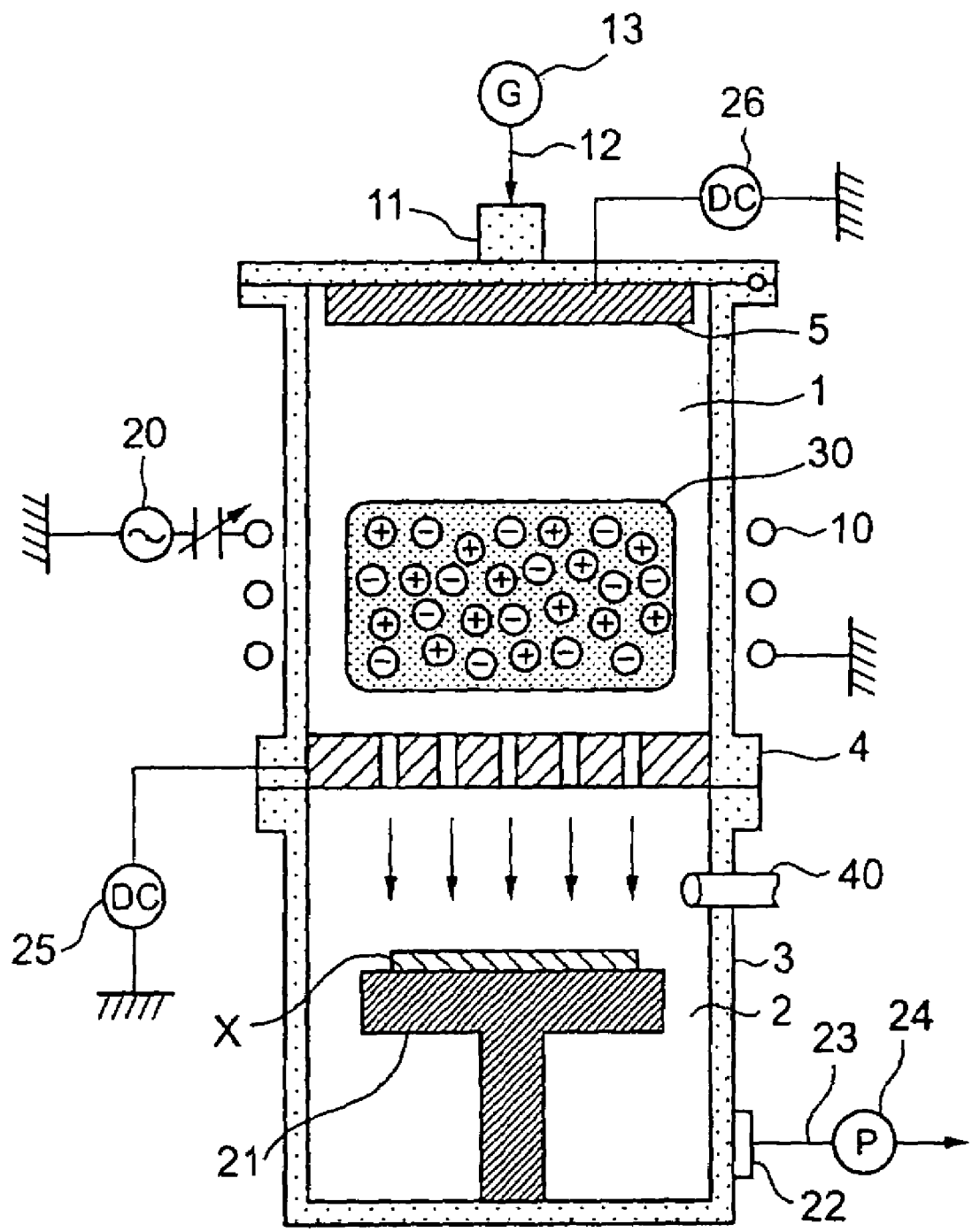
FIG. 1 is a schematic view showing a whole arrangement of an etching apparatus according to a first embodiment of the present invention.

An etching apparatus according to embodiments of the present invention will be described in detail below with reference to FIGS. 1 through 5. Like or corresponding components are denoted by like or corresponding reference numerals throughout drawings, and will not be described below repetitively.

FIG. 1 is a schematic view showing a whole arrangement of an etching apparatus according to a first embodiment of the present invention, with electric components in block form. As shown in FIG. 1, the etching apparatus comprises a cylindrical vacuum chamber 3 constituted by a beam generating chamber 1 for generating a neutral particle beam and a process chamber 2 housing therein a workpiece X such as a semiconductor substrate, a glass workpiece, an organic workpiece, or a ceramic workpiece. The beam generating chamber 1 of the vacuum chamber 3 has walls made of quartz glass or ceramics, and the process chamber 2 of the vacuum chamber 3 has walls made of metal.

The beam generating chamber 1 has a coil 10 disposed therearound for inductively coupled plasma (ICP). The coil 10 is housed in a water-cooled tube having an outside diameter of about 8 mm, for example. The coil 10 of about two turns is wound around the beam generating chamber 1. The coil 10 is electrically connected to a high-frequency power supply 20, which applies a high-frequency voltage having a frequency of about 13.56 MHz, for example, to the coil 10. When a high-frequency current is supplied from the high-frequency power supply 20 to the coil 10, an induced magnetic field is produced in the beam generating chamber 1 by the coil 10. The varying magnetic field induces an electric field, which accelerates electrons to generate a plasma 30 in the beam generating chamber 1. Thus, the coil 10 and the high-frequency power supply 20 constitute a plasma generator for generating a plasma 30 in the beam generating chamber 1.

The beam generating chamber 1 has a gas inlet port 11 defined in an upper portion thereof for introducing a gas into the beam generating chamber 1. The gas inlet port 11 is connected through a gas supply pipe 12 to a gas supply source 13, which supplies a gas such as $SF_6$, $CHF_3$, $CF_4$, $Cl_2$, Ar, $O_2$, $N_2$, $C_4F_8$, $CF_3I$, and $C_2F_4$ to the beam generating chamber 1.

The process chamber 2 houses a workpiece holder 21 therein for holding the workpiece X. The workpiece X is placed on an upper surface of the workpiece holder 21. The process chamber 2 has a gas outlet port 22 defined in a sidewall thereof for discharging the gas from the process chamber 2. The gas outlet port 22 is connected through a gas outlet pipe 23 to a vacuum pump 24, which operates to maintain the process chamber 2 at a predetermined pressure.

The process chamber 2 has an end point detector 40 provided at the sidewall thereof for monitoring the etching process and detecting an end point of the etching process. The end point detector 40 may comprise a quadrupole mass spectrometer, for example. Alternatively, the end point detector 40 may utilize laser interference or ellipsometry to detect an end point of the etching process.

Figure 2A:
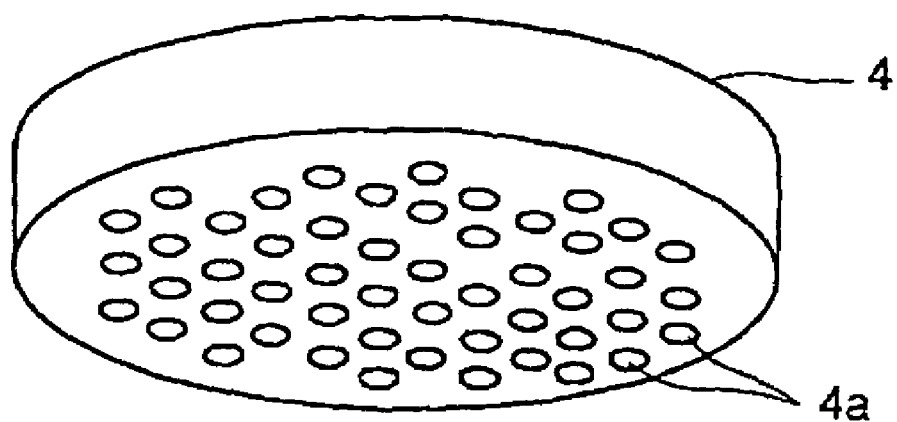
FIG. 2A is a perspective view showing an orifice electrode in the etching apparatus shown in FIG. 1.
Figure 2B:
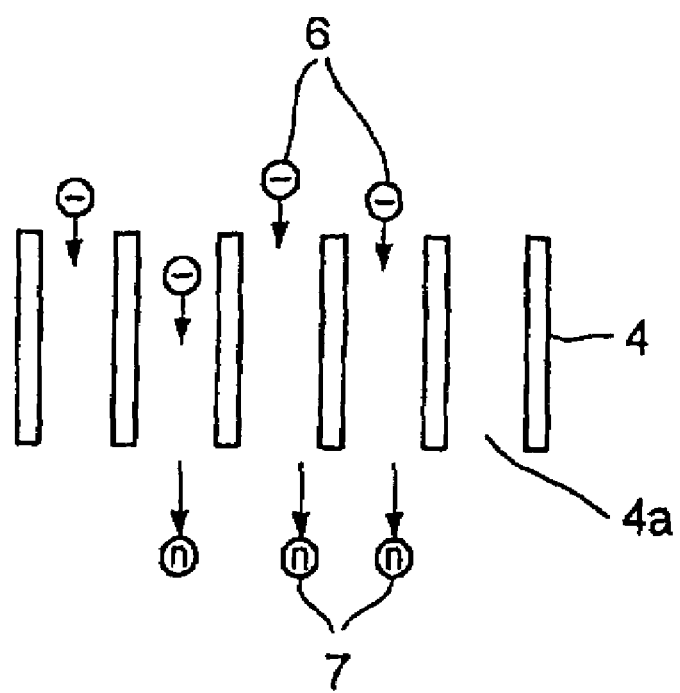
FIG. 2B is a vertical cross-sectional view partially showing the orifice electrode shown in FIG. 2A.

An orifice plate (orifice electrode) 4 made of an electrically conductive material such as graphite is disposed as a first electrode in the lower end of the beam generating chamber 1. The orifice electrode 4 is electrically connected to a DC power supply 25. FIG. 2A is a perspective view showing the orifice electrode 4, and FIG. 2B is a vertical cross-sectional view partially showing the orifice electrode 4 shown in FIG. 2A. As shown in FIGS. 2A and 2B, the orifice electrode 4 has a number of orifices 4a defined therein. Typically, the orifice electrode 4 has a number of orifices 4a each having a diameter of 1 mm and a length of 10 mm, and the orifices 4a are arranged with a pitch of 1.4 mm. The beam generating chamber 1 is separated from the process chamber 2 by the orifice plate 4. Therefore, the pressure of the process chamber 2 can be set to be lower than that of the beam generating chamber 1 with the vacuum pump 24.

An electrode 5 made of an electrically conductive material is disposed as a second electrode in the upper end of the beam generating chamber 1. The electrode 5 is electrically connected to a DC power supply 26. The electrode 5 may comprise a plate made of metal, silicon, or graphite and having no holes. Alternatively, the electrode 5 may comprise a plate having a number of holes defined therein for introducing the gas uniformly into the beam generating chamber 1. The DC power supply 25 and the DC power supply 26 constitute a voltage applying unit for applying a voltage between the orifice electrode 4 and the electrode 5.

Operation of the etching apparatus according to the present embodiment will be described below. In the present embodiment, an etching process (gate etching process) of etching a polycrystalline silicon layer formed on a silicon oxide film of a semiconductor substrate will be described as an example.

The vacuum pump 24 is driven to evacuate the vacuum chamber 3, and then a gas such as $SF_6$ is introduced from the gas supply source 13 into the beam generating chamber 1. For example, the pressure in the beam generating chamber 1 is set to be 0.1 Pa, and the pressure in the processing chamber 2 is set to be 1 Pa. A high-frequency voltage having a frequency of about 13.56 MHz is applied to the coil 10 for 50 microseconds by the high-frequency power supply 20, so that a high-frequency electric field is produced in the beam generating chamber 1. The gas introduced into the beam generating chamber 1 is ionized by electrons that are accelerated by the high-frequency electric field, for thereby generating a high-density plasma 30 in the beam generating chamber 1. The plasma 30 is mainly composed of positive ions and heated electrons.

Then, the high-frequency voltage applied by the high-frequency power supply 20 is interrupted for 50 microseconds. As a result, the electron temperature is lowered by inelastic collision of the electrons, and the electrons are attached to the residual process gas to generate negative ions. Thereafter, the high-frequency voltage is applied again to the coil 10 for 50 microseconds by the high-frequency power supply 20 to heat the electrons in the plasma in the beam generating chamber 1. Thus, the above cycle is repeated. In this manner, the application of the high-frequency voltage for 50 microseconds and the interruption of the high-frequency voltage for 50 microseconds are alternately repeated. The period of time (50 microseconds) for which the high-frequency voltage is interrupted is sufficiently longer than a period of time in which the electrons in the plasma 30 are attached to the residual process gas to generate negative ions, and sufficiently shorter than a period of time in which the electron density in the plasma 30 is lowered to extinguish the plasma. The period of time (50 microseconds) for which the high-frequency voltage is applied is long enough to recover the energy of the electrons in the plasma 30 which has been lowered during the interruption of the high-frequency voltage.

While ordinary plasmas are mostly composed of positive ions and electrons, the etching apparatus according to the present embodiment can efficiently generate a plasma in which positive ions and negative ions coexist therein. Although the high-frequency voltage is interrupted for 50 microseconds in the above example, it may be interrupted for a period of time ranging from 50 to 100 microseconds to generate a large quantity of negative ions as well as positive ions in the plasma.

The DC power supply 25 applies a voltage of −50 V to the orifice plate 4, and the DC power supply 26 applies a voltage −100 V to the electrode 5. Accordingly, a potential difference is produced between the orifice electrode 4 and the electrode 5. Therefore, as shown in FIG. 2B, the negative ions 6 generated in the beam generating chamber 1 are accelerated toward the orifice electrode 4 by the potential difference and introduced into the orifices 4a defined in the orifice electrode 4. Most of the negative ions 6 that are passing through the orifices 4a in the orifice electrode 4 are collided with the sidewall surfaces of the orifices 4a and hence neutralized in the vicinity of solid sidewall surfaces of the orifices 4a, or are collided with gas molecules remaining within the orifices 4a and hence neutralized by charge exchange with the gas molecules. Thus, the negative ions are converted into neutral particles (fluorine atoms) 7.

The orifice electrode 4 serves not only to neutralize the ions, but also to collimate the neutral particle beam and further to separate the beam generating chamber 1 and the process chamber 2 from each other. The workpiece can highly accurately be etched with the collimated neutral particle beam. Since the beam generating chamber 1 and the process chamber 2 are separated from each other, the pressure of the process chamber 2 can be set to be lower than the pressure of the beam generating chamber 1, so that the accurate etching can be achieved. Further, the orifice electrode 4 which separates the beam generating chamber 1 and the process chamber 2 from each other can prevent a radiation produced by the plasma from being applied to the workpiece X. Specifically, since the beam generating chamber 1 where the plasma is generated is isolated from the workpiece X by the orifice electrode 4, the radiation produced by the plasma is not substantially applied to the workpiece X. Therefore, it is possible to reduce adverse effects on the workpiece X due to the radiation such as an ultraviolet ray which would otherwise damage the workpiece X.

Figure 3A:
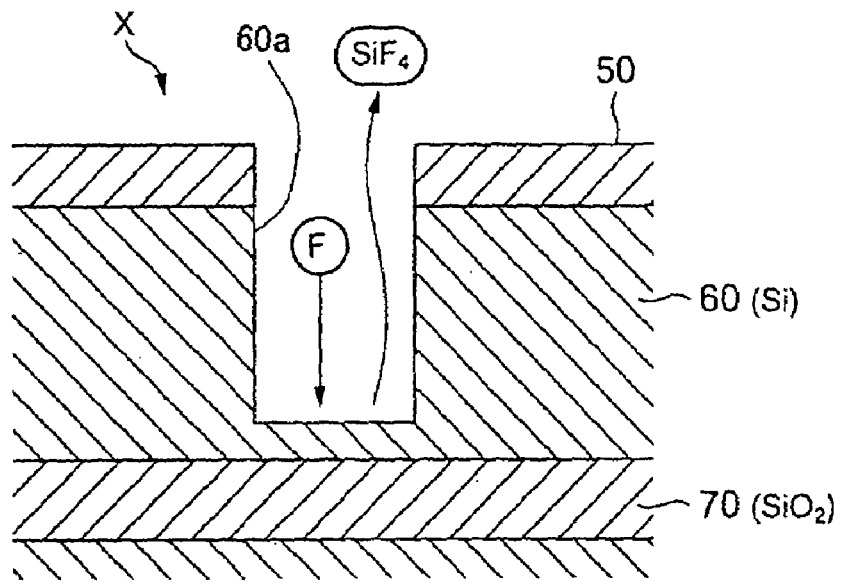
FIGS. 3A and 3B are schematic views showing an etching process in the etching apparatus shown in FIG. 1.

As described above, the negative ions that have been neutralized when passing through the orifices 4a, i.e., fluorine atoms, are emitted as an energetic beam having a low energy into the process chamber 2. The fluorine atoms travel directly in the process chamber 2 and are applied to the workpiece (semiconductor substrate) X placed on the workpiece holder 21. As shown in FIG. 3A, the fluorine atoms applied to the workpiece X are spontaneously sublimed as $SiF_4$ on the processing layer (polycrystalline silicon layer) 60 of the workpiece X according to the following thermochemical equation.

$$Si + 4F \rightarrow SiF_4 \uparrow$$

Thus, the etching process is performed at portions of the polycrystalline silicon layer 60 which are not covered with a mask 50. As shown in FIG. 3A, the etching portion has a sidewall 60a formed in the polycrystalline silicon layer 60. Although the mask 50 is a resist made of organic matter, the mask 50 is not sputtered by the beam because the beam has a low energy. The beam for etching the polycrystalline silicon layer 60, i.e., a first neutral particle beam, should preferably have an energy ranging from 10 eV to 50 eV.

Figure 3B:
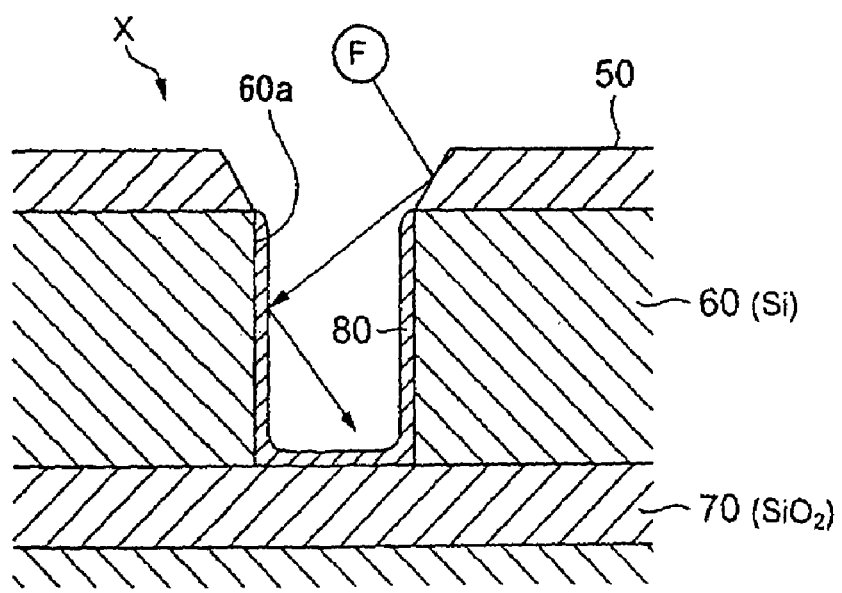

In this etching process, the end point detector 40 detects an end point of the process. When the end point detector 40 detects an end point of the etching process (immediately before or immediately after the silicon oxide film 70 is exposed), the DC power supply 25 changes the voltage to be applied to the orifice electrode 4 from l50 V to +100 V, for example. The change of the voltage applied to the orifice electrode 4 increases the energy of the beam emitted into the process chamber 2. Therefore, the mask 50 made of organic matter is sputtered by the beam having an increased energy, for thereby forming an organic film 80 of $CH_xF_y$ on the sidewall 60a of the polycrystalline silicon layer 60 as shown in FIG. 3B. Thus, the sidewall 60a of the polycrystalline silicon layer 60 is covered with the organic film 80. The organic film 80 serves as a protecting film for protecting the sidewall 60a of the polycrystalline silicon layer 60 from being etched by the fluorine atoms. The beam for forming the protecting film 80, i.e., a second neutral particle beam, should preferably have an energy ranging from 50 eV to 200 eV.

After the organic film 80 having a predetermined thickness is deposited on the sidewall 60a of the polycrystalline silicon layer 60, the DC power supply 25 changes the voltage to be applied to the orifice plate 4 from +100 V to −50 V. As a result, an energetic beam (the first neutral particle beam) having a low energy and a high reactivity is emitted again into the process chamber 2. Since the protecting film 80 has been deposited on the sidewall 60a of the polycrystalline silicon layer 60, the sidewall 60a of the polycrystalline silicon layer 60 is not etched by the beam. Therefore, the highly accurate etching process can be achieved. Since the etching process in the present embodiment utilizes F radicals which are more reactive than Cl radicals or Br radicals, the etching rate can be increased.

Figure 4A:
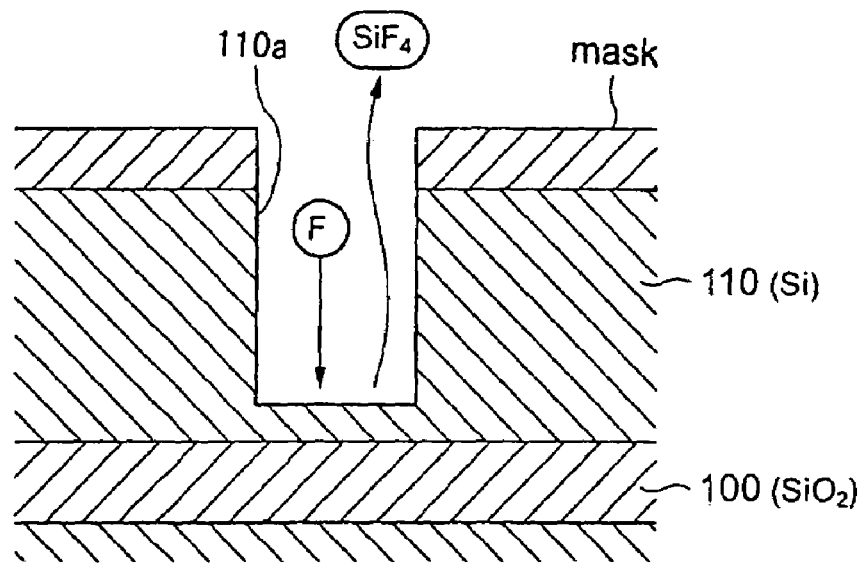
FIGS. 4A and 4B are schematic views showing an example of an etching process.

As shown in FIG. 4A, in the case of an etching process (gate etching process) of etching a polycrystalline silicon layer 110 formed on an underlying silicon oxide film 100 with use of a collimated fluorine neutral particle beam having an energy ranging from 10 eV to 50 eV, the polycrystalline silicon layer 110 is etched in a vertical direction according to the following thermochemical equation.

$$Si + 4F \rightarrow SiF_4 \uparrow$$

Figure 4B:
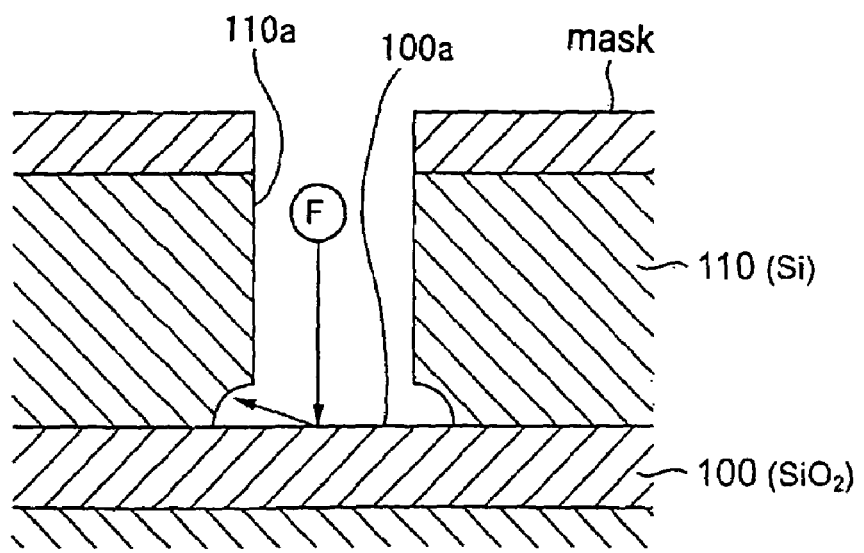

Since the silicon oxide film 100 does not react with the fluorine atoms, even if the etching process is performed until the silicon oxide film 100 is exposed, the silicon oxide film 100 is not etched by the beam. Therefore, the workpiece X can be etched with a high selectivity of $Si/SiO_2$. In this case, however, the sidewall 110a of the polycrystalline silicon layer 110 may be etched by the fluorine atoms reflected on the surface 100a of the silicon oxide film 100, resulting in etching profile irregularities, as shown in FIG. 4B. According to the present embodiment, as shown in FIG. 3B, the mask 50 is sputtered to form the protecting film 80 on the sidewall 60a of the polycrystalline silicon layer 60 for protecting the sidewall 60a of the polycrystalline silicon layer 60 from being etched by the fluorine neutral particle beam. Therefore, according to the present embodiment, it is possible to prevent the aforementioned etching profile irregularities from being caused by the fluorine neutral particle beam.

In the present embodiment, the mask 50 is sputtered to form the protecting film 80 on the sidewall 60a of the polycrystalline silicon layer 60. Instead of the mask 50, other shielding members may be used for covering at least a portion of the surface of the processing layer. For example, an orifice electrode 4 made of graphite is sputtered to generate a $CF_x$ beam, for thereby forming the protecting film on the sidewall of the processing layer. Alternatively, a meshed shielding plate made of organic matter may be inserted between the orifice electrode 4 and the workpiece X, and the shielding plate may be sputtered to form the protecting film on the sidewall of the processing layer.

Figure 5:
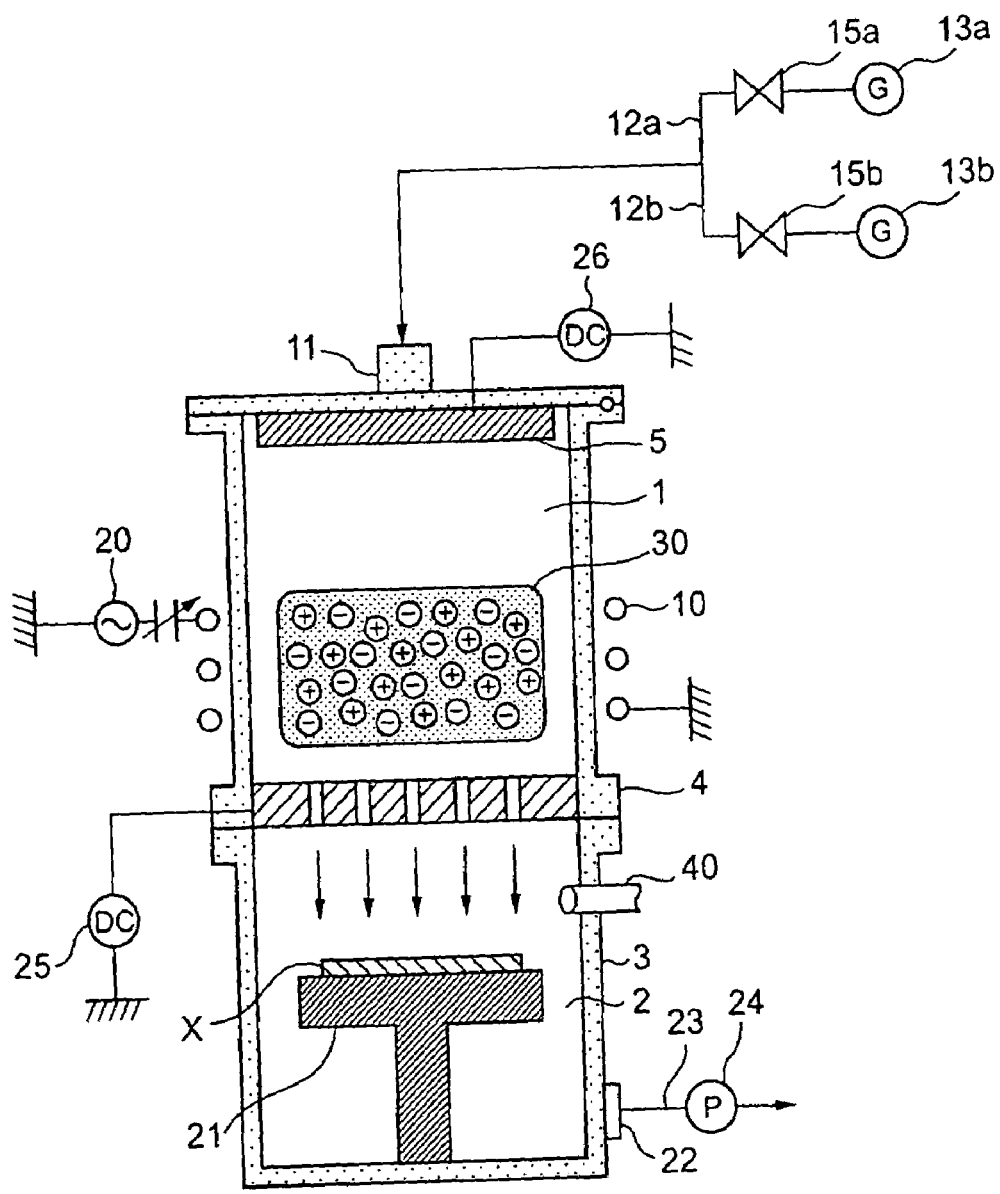
FIG. 5 is a schematic view showing a whole arrangement of an etching apparatus according to a second embodiment of the present invention.

FIG. 5 is a schematic view showing a whole arrangement of an etching apparatus according to a second embodiment of the present invention, with electric components in block form. As shown in FIG. 5, a gas inlet port 11 is connected through two branched gas supply pipes 12a, 12b to gas supply sources 13a, 13b. The gas supply source 13a supplies a first gas such as $SF_6$ to the beam generating chamber 1, and the gas supply source 13b supplies a second gas such as a fluorocarbon ($C_4F_8$, $CHF_3$, $C_2F_4$, or the like) to the beam generating chamber 1. The gas supply pipes 12a, 12b have valves 15a, 15b provided thereon, respectively.

Operation of the etching apparatus according to the present embodiment will be described below. First, the valve 15b of the gas supply pipe 12b is closed, and the valve 15a of the gas supply pipe 12a is opened. As a result, an etching gas such as $SF_6$ is introduced from the gas supply source 13a into the beam generating chamber 1. As with the first embodiment, a first neutral particle beam (fluorine atom beam) is generated from the plasma 30 in the beam generating chamber 1 and emitted into the processing chamber 2. Portions of a polycrystalline silicon layer which are not covered with a mask are etched by the neutral particle beam having a low energy ranging from 10 eV to 50 eV.

When an end point of the etching process is detected by the end point detector 40, the valve 15a of the gas supply pipe 12a is closed and the valve 15b of the gas supply pipe 12b is opened. As a result, a gas such as $C_4F_8$, $CHF_3$, or $C_2F_4$ is introduced from the gas supply source 13b into the beam generating chamber 1. Positive ions ($CF_x^+$ such $CF_2^+$, $CF^+$, or $CF_3^+$) are generated from the plasma 30 in the beam generating chamber 1. The positive ions are accelerated and neutralized to generate a second neutral particle beam. The neutral particle beam is emitted into the processing chamber 2, for thereby forming a polymeric film of $CF_x$ on a sidewall of the polycrystalline silicon layer. Thus, the sidewall of the polycrystalline silicon layer is covered with the polymeric film. The polymeric film serves as a protecting film for protecting the sidewall of the polycrystalline silicon layer from being etched by the fluorine atoms as with the organic film 80 in the first embodiment.

After the protecting film having a predetermined thickness is deposited on the sidewall of the polycrystalline silicon layer, the valve 15b of the gas supply pipe 12b is closed and the valve 15a of the gas supply pipe 12a is opened. As a result, the etching gas is introduced into the beam generating chamber 1, and hence the first neutral particle beam (fluorine atom beam) is emitted into the processing chamber 2. Since the protecting film of $CF_x$ has been deposited on the sidewall of the polycrystalline silicon layer, the sidewall of the polycrystalline silicon layer are not etched by the beam. Therefore, the highly accurate etching process can be achieved.

In the first and second embodiment described above, the etching process of the processing layer and the forming process of the protecting film may be repeated. In this case, the protecting film is not necessarily completely removed by the etching process, and hence the residual protecting film may be formed into a tapered shape. In order to prevent the protecting film from having a tapered shape, the protecting film may be removed from the sidewall of the processing layer after the etching process of the processing layer before the forming process of the protecting film. For example, if a TEOS film is used as a mask and $O_2$ gas is introduced into the processing chamber 2, then the protecting film can be ashed by $O_2$ radicals. Thus, the protecting film can be removed from the sidewall of the processing layer without etching the mask or the processing layer.

Some charged particles may pass through the orifices 4a in the orifice electrode 4. In order to prevent such charged particles from being applied to the workpiece X, a deflector or an electron trap may be disposed downstream of the orifice electrode 4. A voltage is applied to the deflector in a direction perpendicular to a beam traveling direction to change the traveling direction of charged particles, for thereby preventing the charged particles from being applied to the workpiece X. The electron trap produces a magnetic field of about 100 gauss in a direction perpendicular to a beam traveling direction to change the traveling direction of electrons, for thereby preventing the electrons from being applied to the workpiece X.

As well known in the art, when an insulated workpiece such as a workpiece made of glass or ceramics is processed, charge build-up may be developed on the surface of the insulated workpiece. However, by applying neutralized particles to the insulated workpiece as described above, various processes including an etching process and a deposition process can highly accurately be performed on the insulated workpiece with a low charge build-up voltage being maintained. Various types of gases may be introduced into the beam generating chamber 1 according to the type of process to be performed on the workpiece X. For example, in a dry etching process, oxygen or a halogen gas may selectively be used according to the kind of the workpiece X.

In the above embodiment, the plasma is generated with use of a coil for ICP. However, the plasma may be generated with use of an electron cyclotron resonance source (ECR source), a coil for helicon wave plasma, a microwave, or the like. The frequency of the high-frequency voltage is not limited to 13.56 MHz, but may be in the range from 1 MHz to 20 GHz. The voltages applied to the orifice electrode 4 and the electrode 5 are not limited to the above examples.

Although certain preferred embodiments of the present invention have been shown and described in detail, it should be understood that various changes and modifications may be made therein without departing from the scope of the appended claims.

INDUSTRIAL APPLICABILITY

The present invention is applicable to an etching method and apparatus suitable for use in micromachining processes involved in the fabrication of semiconductor devices or the like.

The invention claimed is:

1. An etching method comprising:
    etching a surface of a processing layer of a workpiece by generating a first collimated neutral particle beam from a first gas and applying said first neutral particle beam to the workpiece; and
    forming a protecting film on a sidewall of said processing layer by a second collimated neutral particle beam to protect the sidewall of said processing layer from being etched by said first neutral particle beam; and covering at least a portion of the surface of said processing layer with a shielding member, said forming comprising:
    generating said second collimated neutral particle beam from said first gas; and
    sputtering said shielding member by said second neutral particle beam to form the protecting film on the sidewall of said processing layer.

2. An etching method according to claim 1, wherein said first neutral particle beam has an energy ranging from 10 eV to 50 eV.

3. An etching method according to claim 1, wherein said second neutral particle beam has an energy ranging from 50 eV to 200 eV.

4. An etching method according to claim 1, wherein said forming comprises:
    generating said second collimated neutral particle beam from a second gas; and
    applying said second neutral particle beam to the surface of said processing layer to form the protecting film on the sidewall of said processing layer.

5. An etching method according to claim 4, wherein said processing layer comprises a silicon layer, said first gas includes $SF_6$, and said second gas includes a fluorocarbon gas.

6. An etching method according to claim 1, wherein said processing layer comprises a silicon layer, and a layer underlying said processing layer comprises a silicon oxide film;

wherein said forming is performed immediately before said etching is completed, and then said etching is performed again.

7. An etching method according to claim 1, further comprising:

removing said protecting film formed on the sidewall of said processing layer.

8. An etching method according to claim 7, further comprising repeating said etching, said removing, and said forming.

9. An etching method comprising:

etching a surface of a processing layer of a workpiece by generating a first collimated neutral particle beam from a first gas and applying said first neutral particle beam to the workpiece; and sputtering an electrode, which is used to generate a neutral particle beam, by a second collimated neutral particle beam to form a protecting film on a sidewall of said processing layer to protect the sidewall of said processing layer from being etched by said first neutral particle beam.

10. An etching method according to claim 9, wherein said first neutral particle beam has an energy ranging from 10 eV to 50 eV.

11. An etching method according to claim 9, wherein said second neutral particle beam has an energy ranging from 50 eV to 200 eV.

12. An etching method according to claim 9, wherein said second neutral particle beam is generated from a second gas.

13. An etching method according to claim 12, wherein said processing layer comprises a silicon layer, said first gas includes SF6, and said second gas includes a fluorocarbon gas.

14. An etching method according to claim 9, wherein said processing layer comprises a silicon layer, and a layer underlying said processing layer comprises a silicon oxide film;

wherein said sputtering is performed immediately before said etching is completed, and then said etching is performed again.

15. An etching method according to claim 9, further comprising removing said protecting film formed on the sidewall of said processing layer.

16. An etching method according to claim 15, further comprising repeating said etching, said removing, and said sputtering.

* * * * *